United States Patent
Noguchi et al.

(10) Patent No.: US 9,070,847 B2
(45) Date of Patent: Jun. 30, 2015

(54) ULTRAVIOLET SEMICONDUCTOR LIGHT-EMITTING ELEMENT THAT EMITS ULTRAVIOLET LIGHT FROM ONE SURFACE SIDE

(75) Inventors: Norimichi Noguchi, Saitama (JP); Kenji Tsubaki, Osaka (JP); Takayoshi Takano, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/704,679

(22) PCT Filed: Jun. 17, 2011

(86) PCT No.: PCT/JP2011/063931
§ 371 (c)(1),
(2), (4) Date: Dec. 17, 2012

(87) PCT Pub. No.: WO2011/162180
PCT Pub. Date: Dec. 29, 2011

(65) Prior Publication Data
US 2013/0082297 A1    Apr. 4, 2013

(30) Foreign Application Priority Data

Jun. 21, 2010   (JP) .............................. 2010-140907

(51) Int. Cl.
*H01L 33/00*   (2010.01)
*H01L 27/15*   (2006.01)
(Continued)

(52) U.S. Cl.
CPC ............... *H01L 33/60* (2013.01); *H01L 33/20* (2013.01); *H01L 33/38* (2013.01); *H01L 33/46* (2013.01)

(58) Field of Classification Search
CPC ......... H01L 33/60; H01L 33/20; H01L 33/62; H01L 31/167; H01L 31/0203; H01L 25/167; H01L 25/0753; H01L 27/153; H01L 31/107; H01L 31/1126; H01L 31/1884; H01L 27/1443; H01L 27/14679; H01L 2/14609; H01L 27/14643; H01L 27/146897
USPC ................ 257/98, 82, 88, 184, 257, 290, 749
See application file for complete search history.

(56) References Cited

U.S. PATENT DOCUMENTS 6,239,005 B1   5/2001  Sumiya et al.
6,946,790 B2 *  9/2005  Fukuda .......................... 313/506

(Continued)

FOREIGN PATENT DOCUMENTS

JP    2005-116794    4/2005
JP    2005-303285    10/2005

(Continued)

OTHER PUBLICATIONS

International Search Report in International Application No. PCT/JP2011/063931, dated Sep. 6, 2011.

(Continued)

*Primary Examiner* — A. Sefer
*Assistant Examiner* — Dilinh Nguyen
(74) *Attorney, Agent, or Firm* — Greenblum & Bernstein, P.L.C.

(57) ABSTRACT

An ultraviolet semiconductor light-emitting element comprises a light-emitting layer which is arranged between an n-type nitride semiconductor layer and a p-type nitride semiconductor layer, an n-electrode that is in contact with the n-type nitride semiconductor layer, and a p-electrode that is in contact with the p-type nitride semiconductor layer. The p-type nitride semiconductor layer is provided with a p-type contact layer that has a band gap smaller than that of the light-emitting layer and is in ohmic contact with the p-electrode. A depressed part is formed in a reverse side surface of a surface of the p-type nitride semiconductor layer that faces the light-emitting layer so as to avoid a formation region on which the p-electrode is formed. A reflective film that reflects ultraviolet light emitted from the light-emitting layer is formed on an inner bottom surface of the depressed part.

17 Claims, 3 Drawing Sheets

(51) Int. Cl.
*H01L 31/12* (2006.01)
*H01L 31/062* (2012.01)
*H01L 31/113* (2006.01)
*H01L 23/48* (2006.01)
*H01L 23/52* (2006.01)
*H01L 29/40* (2006.01)
*H01L 33/60* (2010.01)
*H01L 33/20* (2010.01)
*H01L 33/46* (2010.01)
*H01L 33/38* (2010.01)

(56) References Cited

U.S. PATENT DOCUMENTS

| | | | |
|---|---|---|---|
| 7,221,044 B2 * | 5/2007 | Fan et al. | 257/676 |
| 7,777,305 B2 | 8/2010 | Kuroda et al. | |
| 7,915,636 B2 * | 3/2011 | Lee | 257/103 |
| 7,915,646 B2 | 3/2011 | Takizawa et al. | |
| 7,936,049 B2 | 5/2011 | Kuroda et al. | |
| 2006/0071225 A1 | 4/2006 | Beeson et al. | |
| 2006/0165143 A1 | 7/2006 | Ohno | |
| 2007/0131941 A1 * | 6/2007 | Tanaka et al. | 257/79 |
| 2009/0078943 A1 | 3/2009 | Ishida et al. | |
| 2010/0207136 A1 | 8/2010 | Armitage et al. | |
| 2010/0224908 A1 | 9/2010 | Nakazawa et al. | |
| 2011/0073910 A1 | 3/2011 | Takizawa et al. | |
| 2011/0095335 A1 | 4/2011 | Ishida et al. | |
| 2012/0114004 A1 | 5/2012 | Satoh et al. | |
| 2012/0248456 A1 | 10/2012 | Takano et al. | |
| 2012/0319161 A1 * | 12/2012 | Gotoda et al. | 257/103 |

FOREIGN PATENT DOCUMENTS

| | | |
|---|---|---|
| JP | 2006-344710 | 12/2006 |
| JP | 2008-098249 | 4/2008 |
| JP | 2008-171941 | 7/2008 |

OTHER PUBLICATIONS

M. Asif Khan, et. al., "III-Nitride UV Devices", Japanese Journal of Applied Physics, vol. 44, No. 10, pp. 7191-7206 (2005).

* cited by examiner ively high hole concentration layer that can ensure a comparatlayer, and then a p-type GaN material for the light-emitting =0.4) is used as a
ULTRAVIOLET SEMICONDUCTOR LIGHT-EMITTING ELEMENT THAT EMITS ULTRAVIOLET LIGHT FROM ONE SURFACE SIDE

TECHNICAL FIELD

The present invention relates to an ultraviolet semiconductor light-emitting element using a nitride semiconductor material as a material for a light-emitting layer.

BACKGROUND ART

Ultraviolet semiconductor light-emitting elements that emit light within a UV wavelength range are expected to find application to a variety of fields including sanitary and hygiene, medicine, industry, illumination, precision machinery, and the like.

However, typical ultraviolet semiconductor light-emitting elements using a nitride semiconductor material for a light-emitting layer presently have an emission efficiency and a light output lower than those of nitride semiconductor light-emitting elements that emit blue light. Therefore, the typical ultraviolet semiconductor light-emitting elements have not yet found wide industrial application.

A low emission efficiency of ultraviolet semiconductor light-emitting elements can be attributed to a high density of threading dislocations, predominant nature of non-emitting recombination, and a low internal quantum efficiency or to insufficient performance of a p-type nitride semiconductor layer. In particular, the major reason is a low take-out efficiency of the emitted ultraviolet light to the outside. For example, there has been an ultraviolet semiconductor light-emitting element in which $Al_xGa_{1-x}N$ ($x>=0.4$) is used as a material for the light-emitting layer, and then a p-type GaN layer that can ensure a comparatively high hole concentration is provided as a p-type contact layer for obtaining ohmic contact with a p-electrode in the p-type nitride semiconductor layer (see Non-Patent Document 1). In the ultraviolet semiconductor light-emitting element, since the p-type GaN layer absorbs ultraviolet light with a wavelength equal to or less than 360 nm, ultraviolet light incident upon the p-type GaN layer is absorbed and cannot be taken out, thereby reducing the efficiency of light take-out.

By contrast, an ultraviolet semiconductor light-emitting element has been suggested which has a laminated structure including an n-type nitride semiconductor layer, a light-emitting layer constituted by $Al_xGa_{1-x}N$ ($0.4=<x=<1.0$), and a p-type nitride semiconductor layer on one surface side of a substrate. The p-type nitride semiconductor layer includes a p-type clad layer constituted by an $Al_{y2}Ga_{1-y2}N$ ($x<y2=<1.0$) layer that is richer in Al than the light-emitting layer, and a p-type contact layer constituted by an $Al_{z2}Ga_{1-z2}N$ ($0=<z2<y2$) layer located on the p-type clad layer. In the ultraviolet semiconductor light-emitting element, a groove section is formed in the p-type contact layer, and ultraviolet light can be taken out from the groove section of the p-type contact layer (see Patent Document 1).

PRIOR ART DOCUMENTS

Non-Patent Literature

Non-Patent Document 1: M. ASIF KHAN, et. al., "III-Nitride UV Devices", Jpn. J. Appl. Phys., Vol. 44, No. 10, 2005, p. 7191-7206

Patent Literature

Patent Document 1: Japanese Patent Application Publication No. 2008-171941

DISCLOSURE OF THE INVENTION

Problems to be Resolved by the Invention

In the ultraviolet semiconductor light-emitting element described in the abovementioned Patent Document 1, since a sapphire substrate or a SiC substrate is used, ultraviolet light can be taken out from both surface sides in the thickness direction. In other words, in this ultraviolet semiconductor light-emitting element, ultraviolet light is taken out from the other surface side of the substrate and from the surface side in a zone corresponding to the groove section formed in the p-type contact layer. As a result, large amount of ultraviolet light can be taken out from the ultraviolet semiconductor light-emitting element as a whole.

However, when an ultraviolet semiconductor light-emitting element is actually used, a structure is preferred in which ultraviolet light is taken out only from one surface in the thickness direction. This is because a flip-chip is often mounted since the internal quantum efficiency is low and the injected power is almost entirely converted into heat. In this case, when the ultraviolet semiconductor light-emitting element disclosed in the above Patent Document 1 is mounted for use in a package, ultraviolet light taken out from the surface side of the zone corresponding to the groove section formed in the p-type contact layer is absorbed by the package or attenuated by multiple reflections that are generated between the package and the p-electrode.

In consideration of the above reason, it is an objective of the present invention to provide an ultraviolet semiconductor light-emitting element, which can improve the light take-out efficiency from one surface side in the thickness direction.

Means of Solving the Problems

An ultraviolet semiconductor light-emitting element of the present invention comprises: a light-emitting layer 4 which is arranged between an n-type nitride semiconductor layer 3 and a p-type nitride semiconductor layer 5; an n-electrode 6 that is in contact with the n-type nitride semiconductor layer 3; and a p-electrode 7 that is in contact with the p-type nitride semiconductor layer 5, wherein a depressed part 8 is formed in a reverse side surface of a surface of the p-type nitride semiconductor layer 5 facing the light-emitting layer 4 so as to avoid an region on which the p-electrode 7 is formed, and a reflective film 9 that reflects ultraviolet light emitted from the light-emitting layer 4 is formed on an inner bottom surface of the depressed part 8.

Also, An ultraviolet semiconductor light-emitting element of the present invention comprises: a light-emitting layer which is arranged between an n-type nitride semiconductor layer and a p-type nitride semiconductor layer; an n-electrode that is in contact with the n-type nitride semiconductor layer; and a p-electrode that is in contact with the p-type nitride semiconductor layer, wherein the p-type nitride semiconductor layer comprises at least a p-type contact layer that has a band gap smaller than that of the light-emitting layer and is in ohmic contact with the p-electrode, wherein a depressed part is formed in a reverse side surface of a surface of the p-type nitride semiconductor layer facing the light-emitting layer so as to avoid an region on which the p-electrode is formed, and a reflective film that reflects ultraviolet light emitted from the light-emitting layer is formed on an inner bottom surface of the depressed part.

In the ultraviolet semiconductor light-emitting element, preferably, the depressed part formed in the p-type nitride semiconductor layer comprises a plurality of depressed parts.

In the ultraviolet semiconductor light-emitting element, preferably, the p-type nitride semiconductor layer includes the p-type contact layer and a p-type clad layer having a band gap larger than that of the p-type contact layer in this order from the p-electrode side.

In the ultraviolet semiconductor light-emitting element, preferably, the reflective film is extended to above the p-electrode.

Effect of the Invention

The ultraviolet semiconductor light-emitting element of the present invention can improve the light take-out efficiency from one surface side in the thickness direction.

BRIEF DESCRIPTION OF THE DRAWINGS

FIG. 1 shows an ultraviolet semiconductor light-emitting element according to Embodiment 1.

FIG. 2 shows an ultraviolet semiconductor light-emitting element according to Embodiment 2.

FIG. 3 shows an ultraviolet semiconductor light-emitting element according to Embodiment 3.

BEST MODE FOR CARRYING OUT THE INVENTION

Embodiment 1

Figure 1A:
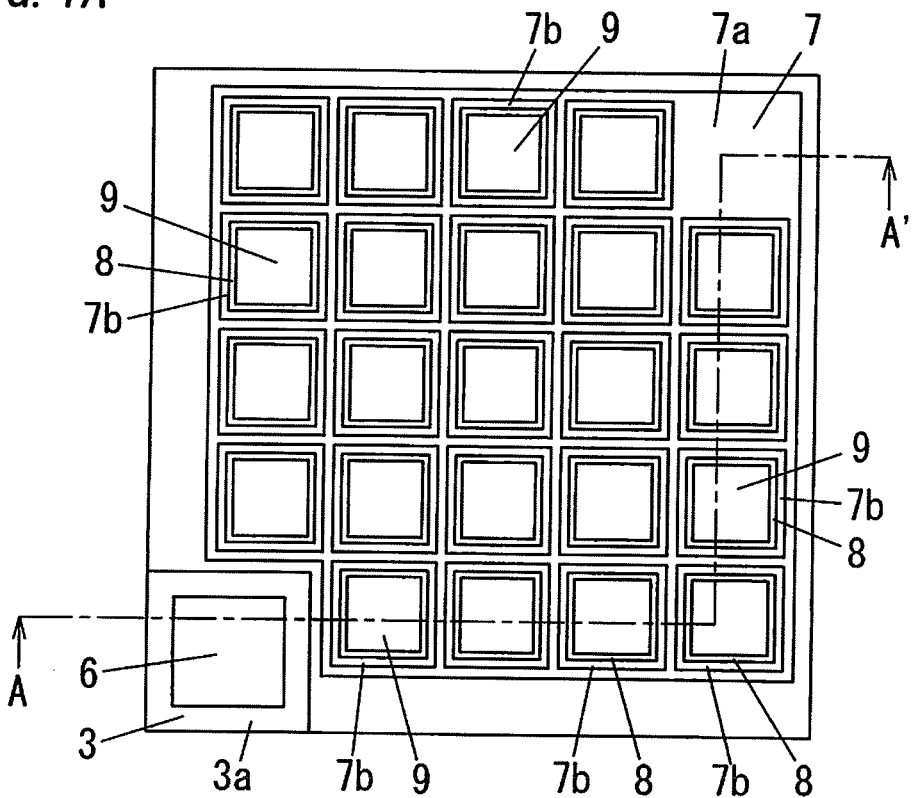
FIG. 1A is a schematic plan view.

An ultraviolet semiconductor light-emitting element according to the present embodiment will be described below with reference to FIG. 1.

The ultraviolet semiconductor light-emitting element according to the present embodiment is an ultraviolet light-emitting diode in which an n-type nitride semiconductor layer 3 is formed on one surface side of a substrate 1, with a buffer layer 2 being interposed therebetween. Further, in the ultraviolet light-emitting diode, a light-emitting layer 4 is formed on the surface side of the n-type nitride semiconductor layer 3, and a p-type nitride semiconductor layer 5 is formed on the surface side of the light-emitting layer 4.

Therefore, the ultraviolet semiconductor light-emitting element has the n-type nitride semiconductor layer 3, the p-type nitride semiconductor layer 5, and the light-emitting layer 4. The light-emitting layer 4 is disposed between the n-type nitride semiconductor layer 3 and the p-type nitride semiconductor layer 5. Further, the p-type nitride semiconductor layer 5 has a contact surface that is in contact with the light-emitting layer 4. The p-type nitride semiconductor layer 5 has a first surface and a second surface. The second surface of the p-type nitride semiconductor layer 5 is defined as a surface that is contact with the light-emitting layer 4. The first surface of the p-type nitride semiconductor layer 5 is located in the reverse side of the second surface of the p-type nitride semiconductor layer 5, when viewed from the p-type nitride semiconductor layer 5.

The n-type nitride semiconductor layer 3, the light-emitting layer 4, and the p-type nitride semiconductor layer 5 are arranged side by side in the order of description. The direction in which the n-type nitride semiconductor layer 3, the light-emitting layer 4, and the p-type nitride semiconductor layer 5 are arranged is defined as the thickness direction of the ultraviolet semiconductor light-emitting element.

Further, the ultraviolet semiconductor light-emitting element has an angular mesa structure on the abovementioned one surface side of the substrate 1, and an n-electrode (cathode electrode) 6 and a p-electrode (anode electrode) 7 are arranged in the lateral direction on the abovementioned one surface side of the substrate 1. Thus, in the ultraviolet semiconductor light-emitting element, the n-electrode 6 is formed on a surface 3a of the n-type nitride semiconductor layer 3 that is exposed on the light-emitting layer 4 side, and the p-electrode 7 is formed on a surface side of the p-type nitride semiconductor layer 5 (the reverse side surface of a surface the p-type nitride semiconductor layer 5 that faces the light-emitting layer 4 side).

In other words, the p-type nitride semiconductor layer 5 has a first surface and a second surface. The second surface of the p-type nitride semiconductor layer 5 is defined as a surface that is in contact with the light-emitting layer 4. When viewed from the p-type nitride semiconductor layer 5, the first surface of the p-type nitride semiconductor layer 5 is located in the reverse side of the second surface of the p-type nitride semiconductor layer 5. The p-electrode 7 is provided at the first surface of the p-type nitride semiconductor layer 5.

The mesa structure is formed by depositing a laminated film including the buffer layer 2, the n-type nitride semiconductor layer 3, the light-emitting layer 4, and the p-type nitride semiconductor layer 5 on the abovementioned one surface side of the substrate 1 by a MOVPE method or the like, and then patterning the laminated film so as to expose part of the n-type nitride semiconductor layer 3. The surface 3a where the n-electrode 6 is formed in the n-type nitride semiconductor layer 3 is exposed by etching a predetermined region of the laminated film from the surface side of the p-type nitride semiconductor layer 5 to the intermediate section of the n-type nitride semiconductor layer 3.

Therefore, the n-type nitride semiconductor layer 3 has a first surface and a second surface. The first surface of the n-type nitride semiconductor layer 3 is defined as the surface facing the light-emitting layer 4. The second surface of the n-type nitride semiconductor layer 3 is located in the reverse side of the first surface of the n-type nitride semiconductor layer 3, when viewed from the n-type nitride semiconductor layer 3.

The light-emitting layer 4 is disposed on the first surface of the n-type nitride semiconductor layer 3 so that part of the n-type nitride semiconductor layer 3 is exposed. Explaining this configuration in greater detail, the light-emitting layer 4 is disposed on the first surface of the n-type nitride semiconductor layer 3 so that part of the first surface of the n-type nitride semiconductor layer 3 is exposed. In FIG. 1B, the light-emitting layer 4 is directly disposed on the first surface of the n-type nitride semi-conductor layer 3. However, the light-emitting layer 4 is not necessarily directly disposed on the first surface of the n-type nitride semiconductor layer 3. Thus, the configuration in which the light-emitting layer 4 is disposed on the first surface of the n-type nitride semiconductor layer 3 includes the configurations in which the light-emitting layer 4 is directly or indirectly disposed on the first surface of the n-type nitride semiconductor layer 3.

Further, in the ultraviolet semiconductor light-emitting element, depressed parts 8 are formed in a reverse side surface of a surface of the p-type nitride semiconductor layer 5 facing the light-emitting layer 4 so as to avoid a region on which the p-electrode 7 is formed. A reflective film 9 that reflects ultraviolet light emitted from the light-emitting layer 4 is formed on the inner bottom surface 8a of each depressed part 8.

That is, the depressed parts 8 are formed at the first surface of the p-type nitride semiconductor layer 5. The depressed parts 8 are located so as to be shifted with respect to the p-electrode 7 in a direction perpendicular to the thickness direction of the ultraviolet semiconductor light-emitting element.

In other words, the p-electrode 7 and the depressed parts 8 are formed at the first surface of the p-type nitride semiconductor layer 5. The depressed parts 8 are formed outside the region where the p-electrode 7 is formed.

A sapphire substrate in which the abovementioned one surface is a (0001) plane, that is, a C-plane, is used as the aforementioned substrate 1. The substrate 1 is not limited to the sapphire substrate, and any single crystal substrate transparent to the ultraviolet light emitted from the light-emitting layer 4 may be used. Examples of suitable substrates include a spinel substrate, a silicon carbide substrate, a zinc oxide substrate, a magnesium oxide substrate, a zirconium boride substrate, and a III group nitride semiconductor crystal substrate.

The buffer layer 2 is constituted by an AlN layer and is provided to reduce the threading dislocations in the n-type nitride semiconductor layer 3 and also reduce the residual strains in the n-type nitride semiconductor layer 3. The buffer layer 2 is not limited to the AlN layer and may be a nitride semiconductor layer including Al as a constituent element. For example, the buffer layer may be constituted by an AlGaN layer, an AlInN layer, or the like.

The n-type nitride semiconductor layer 3 serves to inject electrons into the light-emitting layer 4, and the thickness or composition thereof is not particularly limited. For example, the n-type nitride semiconductor layer 3 may be constituted by a Si-doped n-type Al0.55Ga0.45N layer formed on the buffer layer 2. The n-type nitride semiconductor layer 3 is not limited to a single-layer structure and may have a multilayer structure. For example, the n-type nitride semiconductor layer may be constituted by a Si-doped n-type Al0.7Ga0.3N layer on the buffer layer 2 and a Si-doped n-type Al0.55Ga0.45N layer on the n-type Al0.7Ga0.3N layer.

The light-emitting layer 4 has a quantum well structure in which barrier layers and well layers are alternately laminated. For example, in the light-emitting layer 4, each barrier layer may be constituted by an Al0.55Ga0.45N layer with a thickness of 8 nm, and each well layer may be constituted by an Al0.40Ga0.60N layer with a thickness of 2 nm. The compositions of the barrier layers and well layers are not particularly limited and may be set, as appropriate, according, for example, to the desired light emission wavelength (light emission peak wavelength) in a wavelength region of 250 nm to 300 nm. The number of well layers in the light-emitting layer 4 is not particularly limited, and the light-emitting layer 4 is not limited to a multiple quantum well structure having a plurality of well layers, and a single quantum well structure having one well layer may be also used. Further, the thickness of the barrier layers and well layers is not particularly limited. The light-emitting layer 4 may have a single-layer structure, and a double heterostructure may be formed by the light-emitting layer 4 and layers (n-type nitride semiconductor layer 3, p-type nitride semiconductor layer 5) on both sides of the light-emitting layer 4 in the thickness direction. The p-type nitride semiconductor layer 5 serves to inject holes into the light-emitting layer 4, and the thickness or composition thereof is not particularly limited. For example, the p-type nitride semiconductor layer may be constituted by a p-type clad layer 5a formed on the light-emitting layer 4, and a p-type contact layer 5b formed on the p-type clad layer 5a. The p-type clad layer 5a includes a first p-type semiconductor layer constituted by a Mg-doped p-type AlGaN layer formed on the light-emitting layer 4 and a second p-type semiconductor layer constituted by a Mg-doped p-type AlGaN layer formed on the first p-type semiconductor layer. Further, the p-type contact layer 5b is constituted by an Mg-doped p-type GaN layer. In this case, the compositions of the first p-type semiconductor layer and the second p-type semiconductor layer are set such that the band gap energy of the first p-type semiconductor layer is larger than the band gap energy of the second p-type semiconductor layer. Further, the composition of the second p-type semiconductor layer is set such that the band gap energy of the second p-type semiconductor layer is the same as the band gap of the barrier layers in the light-emitting layer. In the p-type nitride semiconductor layer 5, the thickness of the first p-type semiconductor layer is set to 15 nm, the thickness of the second p-type semiconductor layer is set to 50 nm, and the thickness of the p-type contact layer 5b is set to 15 nm, but those thicknesses are not particularly limited. Further, the nitride semiconductor used in the p-type nitride semiconductor layer 5 is also not particularly limited, and for example, AlGaInN and InAlN may be used for the p-type clad layer 5a. Furthermore, not only GaN and AlGaInN, but also InGaN and InAlN may be used for the p-type contact layer 5b.

The p-type nitride semiconductor layer 5 may include at least the p-type contact layer 5b, but it is preferred that the p-type nitride semiconductor layer 5 have, in order from the p-electrode 7 side, a laminated structure having the p-type contact layer 5b and the p-type clad layer 5a with a band gap larger than that of the p-type contact layer 5b. With such a laminated structure, it is possible to reduce the contact resistance of the p-type nitride semiconductor layer 5 and the p-electrode 7 and obtain excellent electrical contact (good ohmic contact). Further, with such a laminated structure, it is also possible to reduce the difference in the band gap and the difference in lattice constants between the p-type nitride semiconductor layer 5 and the light-emitting layer 4. The p-type nitride semiconductor layer 5 is not limited to the above-described laminated structure, and a p-type semiconductor layer other than the p-type clad layer 5a may be provided between the p-type clad layer 5a and the light-emitting layer 4. Further, the p-type clad layer 5a is not limited to the two-layer structure and may have a single-layer structure or a two layer structure or a multilayer structure composed of more than two layers.

The n-electrode 6 is in electrical contact with the n-type nitride semiconductor layer 3, and the material, thickness, and laminated structure thereof are not particularly limited, provided that the contact resistance is small and the ohmic contact is possible. The n-electrode 6 may be constituted, for example, by a laminated film including a Ti film with a thickness of 20 nm, an Al film with a thickness of 100 nm, a Ti film with a thickness of 20 nm, and an Au film with a thickness of 200 nm. In order to improve the electrical conductivity in the in-plane direction of the n-electrode 6, a first pad electrode may be provided on the n-electrode 6. In the ultraviolet semiconductor light-emitting element, the substrate 1 has a rectangular outer circumferential shape, the abovementioned surface 3*a* of the n-type nitride semiconductor layer 3 is exposed in one corner from among the four corners of the n-type nitride semiconductor layer 3 formed on the entire surface on the aforementioned one surface side of the substrate 1, and the n-electrode 6 has a rectangular shape in the plan view thereof.

The p-electrode 7 is in electrical contact with the p-type contact layer 5*a* of the p-type nitride semiconductor layer 5, and the material, thickness, and laminated structure thereof are not particularly limited, provided that the contact resistance is small and the ohmic contact can be realized. The p-electrode 7 may be constituted, for example, by a laminated film including a Ni film with a thickness of 20 nm and an Al film with a thickness of 100 nm. In order to improve the electrical conductivity in the in-plane direction of the p-electrode 7, a second pad electrode may be provided on the p-electrode 7. Where the second pad electrode is provided, the electrical current flowing in the p-electrode 7 can be easily uniformly diffused within the surface of the p-electrode 7 and in-plane uniformity of current density in the p-electrode 7 can be increased, and the light emission efficiency is thus improved.

In the ultraviolet semiconductor light-emitting element of the above-described embodiment, the depressed part 8 is formed in a reverse side surface of a surface of the p-type nitride semiconductor layer 5, provided with the p-type contact layer 5*b*, facing the light-emitting layer 4, so as to avoid an region on which the p-electrode 7 is formed. Then, the reflective film 9 that reflects ultraviolet light emitted from the light-emitting layer 4 is formed on the inner bottom surface 8*a* of the depressed part 8. Therefore, quantity of light absorbed in the p-type contact layer 5*b*, from the ultraviolet light emitted from the light-emitting layer 4, can be reduced, and the light take-out efficiency from one surface side of the ultraviolet semiconductor light-emitting element in the thickness direction thereof (in this case, the other surface side of the substrate 1) can be improved.

In the ultraviolet semiconductor light-emitting element of the above-described embodiment, a plurality of depressed parts 8 are formed in the p-type nitride semiconductor layer 5, and the reflective film 8 is formed on the inner bottom surface 8*a* of each depressed part 8. In the ultraviolet semiconductor light-emitting element of this configuration, the p-electrode 7 has a mesh-like shape, and the plurality of depressed parts 8 are formed in regions corresponding to a plurality of rectangular openings (mesh portions) 7*b* of the p-electrode 7 in the p-type nitride semiconductor layer 5. Here, the opening size of each depressed part 8 is less than that of the opening 7*b*. Each depressed part 8 has a rectangular opening. A rectangular reflective film 9 smaller in planar size than the inner bottom surface 8*a* is formed on the inner bottom surface 8*a* of each depressed part 8. In the ultraviolet semiconductor light-emitting element, a plurality of depressed parts 8 are formed, and a reflective film 9 is formed on the inner bottom surface 8*a* of each depressed part 8, thereby increasing the degree of freedom in designing the arrangement of the reflective films 9 for increasing the light take-out efficiency.

Figure 1B:
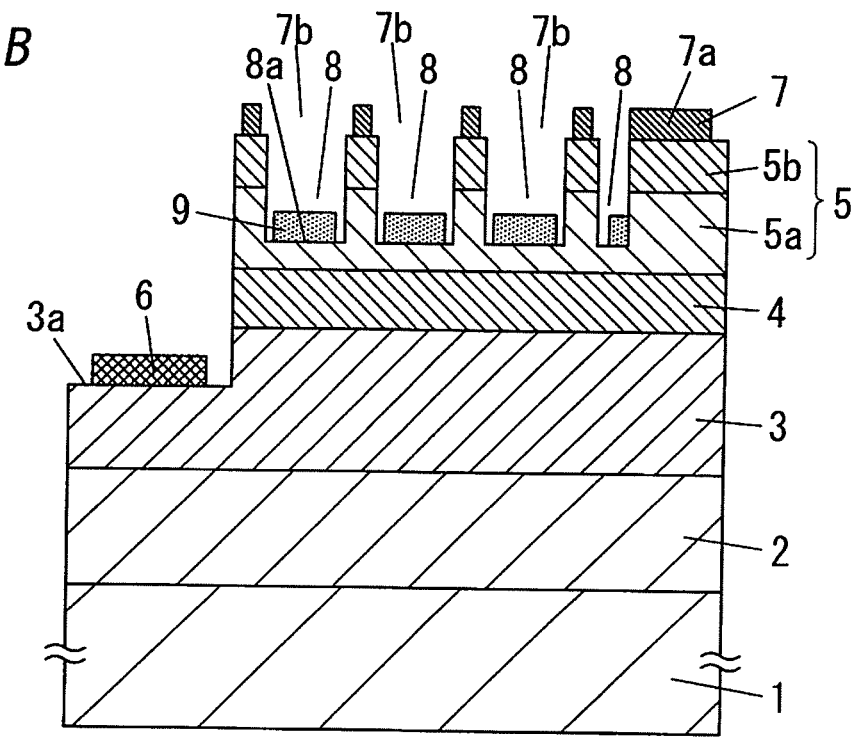
FIG. 1B is a schematic cross-sectional view taken along A-A' in FIG. 1A.

The ultraviolet semiconductor light-emitting element shown in FIG. 1 has a square shape in a planar view thereof, the n-electrode 6 is disposed at one end side of one diagonal of the square, and a rectangular zone 7*a* in which no opening 7*b* is provided in the p-electrode 7 is disposed at the other end side of the diagonal. In the ultraviolet semiconductor light-emitting element of the present embodiment, such shape of the p-electrode 7 and an arrangement of the n-electrode 6 make it possible to increase the in-plane uniformity of the electrical current flowing in the p-type nitride semiconductor layer 5 and increase the light take-out efficiency in combination with the UV reflection effect produced by the reflective films 9.

In the example shown in FIG. 1, the depth dimension of the depressed part 8 is set larger than the thickness dimension of the p-type contact layer 5*b*, and the inner bottom surface 8*a* of the depressed part 8 is configured by the exposed surface of the p-type clad layer 5*a*. In this case, the depressed parts 8 are formed by using a photolithography technique and an etching technique (for example, a dry etching technique).

The depth dimension of the depressed part 8 may be set within a range from the depth dimension at which the thickness of the p-type contact layer 5*b* becomes 10 nm (that is, the thickness of the p-type contact layer 5*b* minus 10 nm) to the depth dimension at which the surface of the light-emitting layer 4 facing the p-type nitride semiconductor layer 5 side is exposed (thickness dimension of the p-type nitride semiconductor layer 5). In this case, it is preferred that the thickness of the p-type contact layer 5*b* directly below the reflective film 9 be equal to or less than 10 nm (including 0). Where this thickness is equal to or less than 10 nm, the absorption of ultraviolet light in the p-type contact layer 5*b* can be inhibited and the effect of increasing the light take-out efficiency is improved. For example, when the light emission wavelength of the light-emitting layer 4 is 280 nm and the p-type contact layer 5*b* is constituted by a p-type GaN layer with a thickness of 10 nm, where it is assumed that the light incident on the p-type contact layer 5*b* from the p-type clad layer 5*a* is transmitted by the p-type contact layer 5*b* and reflected and returned by the reflective film 9, about 30% of the ultraviolet light is absorbed by the p-type contact layer 5*b* alone. Therefore, where the thickness of the p-type contact layer 5*b* directly below the reflective film 9 exceeds 10 nm, the effect of increasing the light take-out efficiency is decreased even if the reflectance of the reflective film 9 is increased. In other words, where the thickness of the p-type contact layer 5*b* directly below the reflective film 9 is equal to or less than 10 nm, the absorption of light in a zone of the p-type contact layer 5*b* directly below the reflective film 9 can be inhibited and the effect of increasing the light take-out efficiency is improved. Further, from the standpoint of electrical contact ability, it is preferred that the p-type contact layer 5*b* be thick. Therefore, the upper limit of the thickness of the p-type contact layer 5*b* directly below the reflective film 9 is taken as 10 nm, in consideration of an allowed limit for both the light absorption and the electrical contact ability. It is also possible that the p-type contact layer 5*b* is not present at all directly below the reflective film 9, but where the thickness of the zone of the p-type contact layer 5*b* directly below the reflective film 9 is equal to or less than 10 nm, the effect of reflection by the reflective film 9 can be obtained, while inhibiting the increase in contact resistance produced by the decrease in surface area of the p-type contact layer 5*b*.

It is preferred that the reflective film 9 have a reflectance equal to or greater than 60% with respect to the ultraviolet light emitted from the light-emitting layer 4. In such a case, the effect of improving the light take-out efficiency can be increased by comparison with that obtained when the reflectance is less than 60%. In other words, where the reflectance becomes less than 60%, the effect of improving the light take-out efficiency is reduced.

When the light emission wavelength of the light-emitting layer 4 is within a wavelength range of 250 nm to 300 nm, the material of the reflective film 9 is preferably selected from Al, Rh, Si, Mo, or alloys thereof. Where the material of the reflective film 9 is selected from such a group, the reflectance of the reflective film 9 with respect to the ultraviolet light emitted from the light-emitting layer 4 can be made greater than 60% and the absorption or transmission of ultraviolet light can be inhibited. For example, in regard to the reflectance with respect to ultraviolet light with a wavelength of 265 nm, a reflectance of Al is 92.5%, a reflectance of Si is 72.2%, a reflectance of Rh is 67.9%, and a reflectance of Mo is 66.7%.

A specific method for manufacturing the ultraviolet semiconductor light-emitting element shown in FIG. 1 will be explained below.

First, the substrate 1 of a sapphire substrate is located in a reaction chamber of a MOVPE device. Then, the substrate temperature is raised to a predetermined temperature (for example, 1250 degrees C.), while maintaining a pressure inside the reaction chamber at a predetermined growth pressure (for example 10 kPa which is about 76 Torr), and the above-mentioned one surface of the substrate 1 is then cleaned by performing heating for a predetermined period (for example, for 10 min). Then, in a state in which the substrate temperature is maintained at a growth temperature (in this case 1250 degrees C.), which is equal to the above predetermined temperature, a flow rate of trimethylaluminum (TMAl) as an aluminum source material is set to 0.05 L/min (50 SCCM) under standard conditions, a flow rate of ammonia (NH3) as a nitrogen source material is set to 0.05 L/min (50 SCCM) under standard conditions, and the TMAl and NH3 are then simultaneously supplied into the reaction chamber to grow the buffer layer 2 constituted by a single-crystal AlN layer. The buffer layer 2 is not limited to the single-crystal AlN layer, and a single-crystal AlGaN layer may be also used.

The n-type nitride semiconductor layer 3 is grown under the following conditions: the growth temperature is set to 1200 degrees C., the growth pressure is set to the abovementioned predetermined growth pressure (in this case 10 kPa), TMAl is used as an aluminum source material, trimethylgallium (TMGa) is used as a gallium source material, NH3 is used as a nitrogen source material, tetraethylsilane (TEST) is used as a source material for silicon which is a dopant imparting n-type conductivity, and H2 gas is used as a carrier gas for transporting the source materials. Here, a flow rate of TESi is set to 0.0009 L/min (0.9 SCCM) under standard conditions. The above-mentioned source materials are not particularly limited. For example, triethylgallium (TEGa) may be used as a gallium source material, a hydrazine derivative may be used as a nitrogen source material, and monosilane (SiH4) may be used as a silicon source material.

The light-emitting layer 4 is grown under the following conditions: the growth temperature is set at 1200 degrees C. which is equal to the growth temperature of the n-type nitride semiconductor layer 3, the growth pressure is set to the abovementioned predetermined growth pressure (in this case 10 kPa), TMAl is used as an aluminum source material, TMGa is used as a gallium source material, and NH3 is used as a nitrogen source material. The growth conditions of the barrier layer of the light-emitting layer 4 are set same as those of the n-type nitride semiconductor layer 3, except than the TESi is not supplied. As for the growth conditions of the wall layer of the light-emitting layer 4, a molar ratio ([TMAl]/{[TMAl]+[TMGa]}) of TMAl in the source materials of group III elements is set lower than that in the growth conditions of the barrier layer to obtain the desired composition. In the present embodiment, the barrier layer is not doped with a dopant, but such configuration is not limited, and an n-type dopant such as silicon may be doped at a concentration such that crystal quality of the barrier layer is not degraded.

The following growth conditions are selected for the first p-type semiconductor layer and the second p-type semiconductor layer of the p-type clad layer 5a in the p-type nitride semiconductor layer 5: the growth temperature is set to 1050 degrees C., the growth pressure is set to the above-mentioned predetermined growth pressure (in this case 10 kPa), TMAl is used as an aluminum source material, TMGa is used as a gallium source material, and NH3 is used as a nitrogen source material, bis(cyclopentadienyl) magnesium (Cp2Mg) is used as a source material of magnesium which is a dopant imparting p-type conductivity, and H2 gas is used as a carrier gas for transporting the source materials. The growth conditions of the p-type contact layer 5b in the n-type nitride semiconductor layer 3 are basically the same as the growth conditions of the second p-type semiconductor layer, the difference being that the supply of TMAl is stopped. In this case, a flow rate of Cp2Mg in the growth of the first p-type semiconductor layer, second p-type semiconductor layer and p-type contact layer 5b is set to 0.02 L/min (20 SCCM) under standard conditions, and the molar ratio (flow rate ratio) of the source materials of group III elements is changed, as appropriate, according to the compositions of the first p-type semiconductor layer, second p-type semiconductor layer, and p-type contact layer 5b.

After the crystal growth process in which the buffer layer 2, n-type nitride semiconductor layer 3, light-emitting layer 4, and p-type nitride semiconductor layer 5 are sequentially grown on the abovementioned one surface side of the substrate 1 under the above-described growth conditions has been completed, the substrate 1 having a laminated structure of the buffer layer 2, n-type nitride semiconductor layer 3, light-emitting layer 4, and p-type nitride semiconductor layer 5 is taken out of the reaction chamber of the MOVPE device.

The n-electrode 6, p-electrode 7, depressed parts 8, and reflective films 9 are then formed.

More specifically, first, a resist layer (referred to hereinbelow as "first resist layer") is formed on a region corresponding to the upper surface of a mesa structure in the laminated film of the buffer layer 2, n-type nitride semiconductor layer 3, light-emitting layer 4, and p-type nitride semiconductor layer 5 by using the photolithography technique. Then, the mesa structure is formed by etching from the surface side of the p-type nitride semiconductor layer 5 to the intermediate section of the n-type nitride semiconductor layer 3 by reactive ion etching by using the first resist layer as a mask. The surface area and shape of the mesa structure are not particularly limited.

After the aforementioned mesa structure has been formed, the first resist layer is removed and then a resist layer (referred to hereinbelow as "second resist layer") is formed by using the photolithography technique. The second resist layer opens at zones corresponding to planned regions in the p-type nitride semiconductor layer 5 on which the depressed parts 8 will be formed. The depressed parts 8 are then formed by reactive ion etching from the surface side of the p-type nitride semiconductor layer 5 to a predetermined depth by using the second resist layer as a mask.

The second resist layer is then removed, and natural oxidation films present on the surfaces of the n-type nitride semiconductor layer 3 and the p-type nitride semiconductor layer 5 are removed by wet etching using BHF (buffered hydrofluoric acid). Further, the reagent for removing the natural oxidation films is not particularly limited to BHF, and other reagents (acids) capable of removing the natural oxidation films may be also used.

After the aforementioned natural oxidation films have been removed, a third resist layer is formed by using the photolithography technique. The third resist layer is patterned such that only a planned region in the above-mentioned one surface side of the substrate 1 (that is, part of the surface 3a of the n-type nitride semiconductor layer 3) on which the n-electrode 6 will be formed is exposed. Then, the n-electrode 6 is formed by an electron beam vapor deposition method, and the third resist layer and the unnecessary film present on the third resist layer are removed by performing lift-off. The RTA treatment (rapid thermal annealing treatment) is thereafter performed in an N2 gas atmosphere so as to ensure ohmic contact between the n-electrode 6 and the n-type nitride semiconductor layer 3. The n-electrode 6 is a laminated film constituted by a Ti film with a thickness of 20 nm, an Al film with a thickness of 100 nm, a Ti film with a thickness of 20 nm, and an Au film with a thickness of 200 nm, and the RTA treatment may be performed, for example, under the following conditions: annealing temperature 900 degrees C. and annealing time 1 min.

A fourth resist layer is patterned and formed, by using the photolithography technique, such that only the planned region in the above-mentioned one surface side of the substrate 1 (that is, part of the surface of the p-type nitride semiconductor layer 5) on which the p-electrode 7 will be formed is exposed. Then, the p-electrode 7 is formed by the electron beam vapor deposition method, and the fourth resist layer and the unnecessary film present on the fourth resist layer are removed by performing lift-off. The RTA treatment (rapid thermal annealing treatment) is thereafter performed in an N2 gas atmosphere so as to ensure ohmic contact between the p-electrode 7 and the p-type contact layer 5b of the p-type nitride semiconductor layer 5. The p-electrode 7 is a laminated film constituted by a Ni film with a thickness of 20 nm and an Al film with a thickness of 100 nm, and the RTA treatment may be performed, for example, under the following conditions: annealing temperature 500 degrees C. and annealing time 10 min.

A fifth resist layer is patterned and then formed, by using the photolithography technique, such that only the planned regions in the abovementioned one surface side of the substrate 1 (that is, parts of the inner bottom surfaces 8a of the depressed parts 8 of the p-type nitride semiconductor layer 5) on which the reflective film 9 will be formed are exposed. Then, the reflective film 9 is formed by the electron beam vapor deposition method, and the fifth resist layer and the unnecessary film present on the fifth resist layer are removed by performing lift-off, thereby producing the ultraviolet semiconductor light-emitting element configured as shown in FIG. 1. The reflective film 9 is an Al film with a thickness of 100 nm. After the reflective film 9 has been formed, heat treatment may be conducted under conditions such that cause no decrease in reflection characteristic of the reflective film 9 in order to improve the adhesion between the reflective film 9 and the p-type nitride semiconductor layer 5.

In the manufacture of the above-described ultraviolet semiconductor light-emitting element, all the steps performed before the formation of the reflective film 9 is completed are performed at a wafer level, and then the division into individual ultraviolet semiconductor light-emitting elements may be carried out by dicing.

Further, in the above embodiment, an example is presented in which the ultraviolet semiconductor light-emitting element is manufactured by using the MOVPE method, but the crystal growth method is not limited to the MOVPE method and, for example, a halide vapor phase growth method (HVPE method) or a molecular beam epitaxy method (MBE method) may be also used. Furthermore, the order of the step of forming the mesa structure and the step of forming the depressed parts 8 may be reversed. The order of the step of forming the n-electrode 6, the step of forming the p-electrode 7, and the step of forming the reflective film 9 may be changed, as appropriate, according to the temperature of heat treatment in each step. Further, when the laminated structures and materials of the n-electrode 6 and the p-electrode 7 can be the same, the step of forming the n-electrode 6 and the step of forming the p-electrode 7 may be performed simultaneously.

The arrangement and shape of the depressed parts 8, n-electrode 6, and p-electrode 7 are not particularly limited and may be designed, as appropriate, according to the circumstances such as an electric current path or a light take-out surface. However, in the case of the ultraviolet semiconductor light-emitting element using the nitride semiconductor (group III nitride semiconductor) such as described hereinabove, the effective mass of holes in the p-type nitride semiconductor layer 5 is larger and therefore practically the entire light emission takes place only in the projection region of the p-electrode 7 in the light-emitting layer 4. Therefore, the arrangement should be designed such that the surface area of the p-electrode 7 is increased, the electric current paths of the p-electrode 7 and n-electrode 6 are reduced, and the light take-out efficiency is increased.

As described above, the ultraviolet semiconductor light-emitting element includes the n-type nitride semiconductor layer 3, p-type nitride semiconductor layer 5, light-emitting layer 4, n-electrode 6, and p-electrode 7. The light-emitting layer 4 is disposed between the n-type nitride semiconductor layer 3 and the p-type nitride semiconductor layer 5. The n-electrode 6 is in contact with the n-type nitride semiconductor layer 3. Then, the p-electrode 7 is in contact with the p-type nitride semiconductor layer 5. The p-type nitride semiconductor layer 5 has a surface located in a reverse side of a surface facing the light-emitting layer 4, when viewed from the p-type nitride semiconductor layer 5. The depressed part 8 is formed in the surface located in the reverse side of the p-type nitride semiconductor layer 5.

The depressed part 8 is formed so as to avoid the planned region on which the p-electrode 7 will be formed. More specifically, the p-type nitride semiconductor layer 5 has the planned region on the p-electrode 7 will be formed, and the depressed part 8 is formed so as to avoid the planned region for the p-electrode 7.

In other words, the depressed part 8 is located in a region other than the p-electrode 7. Still in other words, the ultraviolet semiconductor light-emitting element has a thickness direction. The n-type nitride semiconductor layer 3, light-emitting layer 4, and p-type nitride semiconductor layer 5 are disposed along the thickness direction of the ultraviolet semiconductor light-emitting element. The depressed part 8 does not overlap the p-electrode 7 in the thickness direction of the ultraviolet semiconductor light-emitting element. The depressed part 8 is located so as to be shifted in a direction that intersects the thickness direction of the ultraviolet semiconductor light-emitting element, with respect to the p-electrode 7.

The reflective film 9 that reflects ultraviolet light emitted from the light-emitting layer 4 is formed on an inner bottom surface of the depressed part 8.

In this case, the light take-out efficiency from one surface side of the ultraviolet semiconductor light-emitting element in the thickness direction can be increased.

The n-type nitride semiconductor layer 3 has the first surface facing the light-emitting layer 4. The n-electrode 6 is positioned at part of the n-type nitride semiconductor layer 3, thereby being brought into contact with the n-type nitride semiconductor layer 3. The p-electrode 7 has the first surface facing the p-type nitride semiconductor layer 5. The first surface of the p-type nitride semiconductor layer 5 is located in the reverse side surface of a surface facing the light-emitting layer 4, when viewed from the p-type nitride semiconductor layer 5. The depressed parts 8 are formed in the first surface of the p-type nitride semiconductor layer 5.

In this case, the light take-out efficiency from one surface side of the ultraviolet semiconductor light-emitting element in the thickness direction can be increased.

Further, a plurality of depressed parts 8 are formed in the p-type nitride semiconductor layer 5.

In this case, the light take-out efficiency from one surface side of the ultraviolet semiconductor light-emitting element in the thickness direction can be also increased.

Further, the p-type nitride semiconductor layer 5 has the p-type contact layer 5b. The p-type contact layer 5b has a band gap less than that of the light-emitting layer 4. The p-type contact layer 5b is constituted to be in ohmic contact with the p-electrode 7.

In this case, the contact resistance between the p-type nitride semiconductor layer 5 and the p-electrode 7 can be decreased and excellent electrical contact can be obtained.

Further, the p-type nitride semiconductor layer 5 has the p-type contact layer 5b and the p-type clad layer 5a with a band gap larger than that of the p-type contact layer 5b in the order of description from the p-electrode 7 side.

In this case, the contact resistance between the p-type nitride semiconductor layer 5 and the p-electrode 7 can be also decreased and excellent electrical contact can be also obtained.

The n-type nitride semiconductor layer 3 being in contact with the n-electrode 6 means that the n-type nitride semiconductor layer 3 is in electrical contact with the n-electrode 6. Likewise, the p-type nitride semiconductor layer 5 being in contact with the p-electrode means that the p-type nitride semiconductor layer 5 is in electrical contact with the p-electrode 7. Further, in the present embodiment, the n-electrode 6 is in direct contact with the n-type nitride semiconductor layer 3. The p-electrode 7 is in direct contact with the p-type nitride semiconductor layer 5. However, the n-electrode 6 only has to be in electrical contact with the n-type nitride semiconductor layer 3. Further, the p-electrode 7 only has to be in electrical contact with the p-type nitride semiconductor layer 5.

Embodiment 2

Figure 2A:
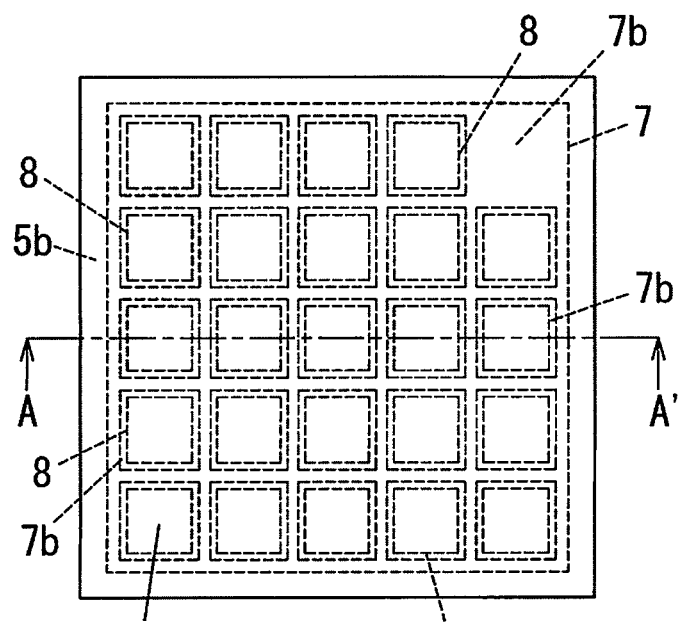
FIG. 2A is a schematic plan view.
Figure 2B:
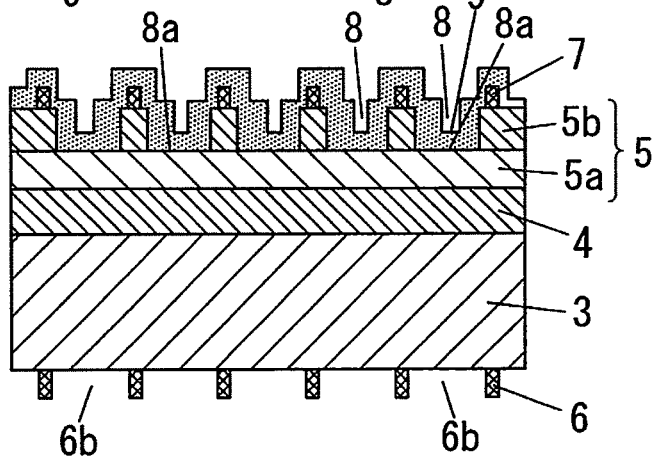
FIG. 2B is a schematic cross-sectional view taken along A-A' in FIG. 2A.
Figure 2C:
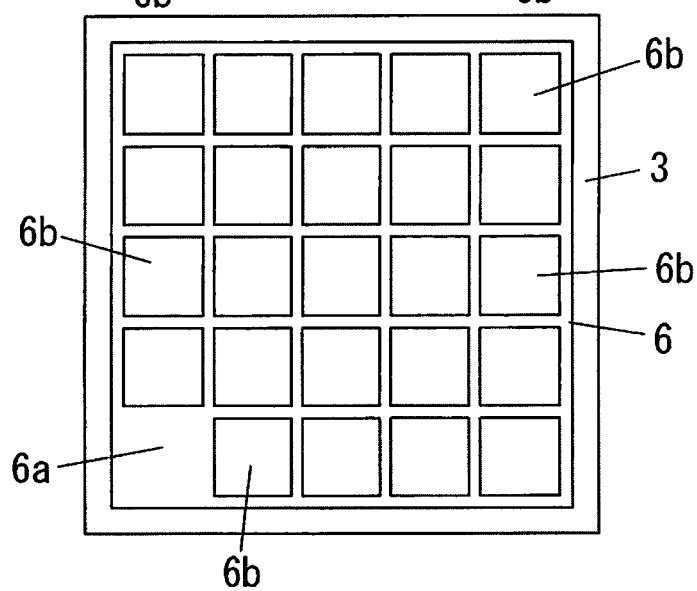
FIG. 2C is a schematic lower surface view.

A basic configuration of an ultraviolet semiconductor light-emitting element according to the present embodiment is substantially similar to that of Embodiment 1, the difference therebetween being in that the ultraviolet semiconductor light-emitting element of Embodiment 1 is provided with the mesa structure, whereas in the present embodiment the substrate 1 (see FIG. 1) explained in Embodiment 1 is absent and the n-electrode 6 is formed in a reverse side surface of a surface of the n-type nitride semiconductor layer 3 that faces the light-emitting layer 4, as shown in FIG. 2. That is, the ultraviolet semiconductor light-emitting element of the present embodiment has the so-called vertical injection structure. The constituent elements similar to those of Embodiment 1 are assigned with same reference numerals and the explanation thereof is herein omitted.

In the ultraviolet semiconductor light-emitting element of the present embodiment, not only the p-electrode 7, but also the n-electrode 6 has a mesh-like shape, and larger portions of the n-electrode 6 and p-electrode 7 face each other (overlap) in the thickness direction of the light-emitting layer 4 in order to increase the light take-out efficiency from one surface side, which is the reverse side surface of the surface of the n-type nitride semiconductor layer 3 that faces the light-emitting layer 4. As a result, in the n-electrode 6, a plurality of openings 6b are formed that are in a one-to-one correspondence relationship with a plurality of openings 7b of the p-electrode 7. Further, in the ultraviolet semiconductor light-emitting element of the present embodiment, a rectangular zone 6a in which no opening 6b is provided in the n-electrode 6 is disposed at one end side of the diagonal line explained in Embodiment 1. In the ultraviolet semiconductor light-emitting element of the present embodiment, such shape and arrangement of the p-electrode 7 and the n-electrode 6 make it possible to increase the in-plane uniformity of the electrical current flowing in the p-type nitride semiconductor layer 5 and increase the light take-out efficiency in combination with the UV reflection effect produced by the reflective films 9. As long as the n-electrode 6 is transparent to the ultraviolet light emitted from the light-emitting layer 4, this electrode may be formed over the entire surface of the reverse side surface of the n-type nitride semiconductor layer 3.

In the manufacture of the ultraviolet semiconductor light-emitting element of the present embodiment, first, similarly to the manufacturing method explained in Embodiment 1, the buffer layer 2, n-type nitride semiconductor layer 3, light-emitting layer 4, and p-type nitride semiconductor layer 5 are sequentially formed on the abovementioned one surface side of the substrate 1 (see FIG. 1) by a crystal growth method such as a MOVPE method. Then, the p-electrode 7, depressed parts 8, reflective films 9 and the like are formed. After this, the substrate 1 is removed by a laser lift off method. The reverse side surface of the surface of the n-type nitride semiconductor layer 3 that faces the light-emitting layer 4 is then exposed by removing the buffer layer 2 and the like by the dry etching technique. The n-electrode 6 is then formed.

As described above, the ultraviolet semiconductor light-emitting element of the present embodiment is provided with the n-type nitride semiconductor layer 3, p-type nitride semiconductor layer 5, light-emitting layer 4, p-electrode 7 and n-electrode 6, in the same manner as in Embodiment 1. The light-emitting layer 4 is disposed between the n-type nitride semiconductor layer 3 and the p-type nitride semiconductor layer 5. The n-electrode 6 is in contact with the n-type nitride semiconductor layer 3. Further, the p-electrode 7 is in contact with the p-type nitride semiconductor layer 5.

The depressed parts 8 are formed in the reverse side surface of the surface of the n-type nitride semiconductor layer 5, provided with the p-type contact layer 5b, facing the light-emitting layer 4, so as to avoid a formation region on which the p-electrode 7 will be formed. Further, the reflective film 9 that reflects ultraviolet light emitted from the light-emitting layer 4 is formed on the inner bottom surface 8a of each depressed part 8. Therefore, the quantity of light absorbed in the p-type contact layer 5b, from the ultraviolet light emitted from the light-emitting layer 4, can be reduced, and the light take-out efficiency from one surface side of the ultraviolet semiconductor light-emitting element in the thickness direction thereof (in this case, the reverse side surface of the surface of the n-type nitride semiconductor layer 3 that faces the light-emitting layer 4) can be increased.

The n-type nitride semiconductor layer 3 has the second surface in a reverse side of a surface that faces the light-emitting layer 4, when viewed from the n-type nitride semiconductor layer 3. The n-electrode 6 is provided on the second surface of the n-type nitride semiconductor layer 3. The p-type nitride semiconductor layer 5 has the first surface in a reverse side of a surface that faces the light-emitting layer 4, when viewed from the p-type nitride semiconductor layer 5. The p-electrode 7 is provided on the first surface of the p-type nitride semiconductor layer 5.

Further, in the ultraviolet semiconductor light-emitting element of the present embodiment, in addition to the decreased resistance of the entire ultraviolet semiconductor light-emitting element, the surface area of the light-emitting layer 4 can be increased, and the light take-out efficiency can be increased.

In the manufacture of the ultraviolet semiconductor light-emitting element of the present embodiment, an electrically conductive single-crystal substrate (for example, n-type silicon carbide substrate) having a type of conductivity same as that of the n-type nitride semiconductor layer 3 may be used as the substrate 1, and the n-electrode 6 may be formed on the above-mentioned other surface side of the substrate 1 (process in which the substrate 1 is not removed).

The ultraviolet semiconductor light-emitting element of the present embodiment has a configuration similar to that of Embodiment 1. As a result, the ultraviolet semiconductor light-emitting element can have a combination of technical features disclosed in Embodiment 1.

Embodiment 3

Figure 3A:
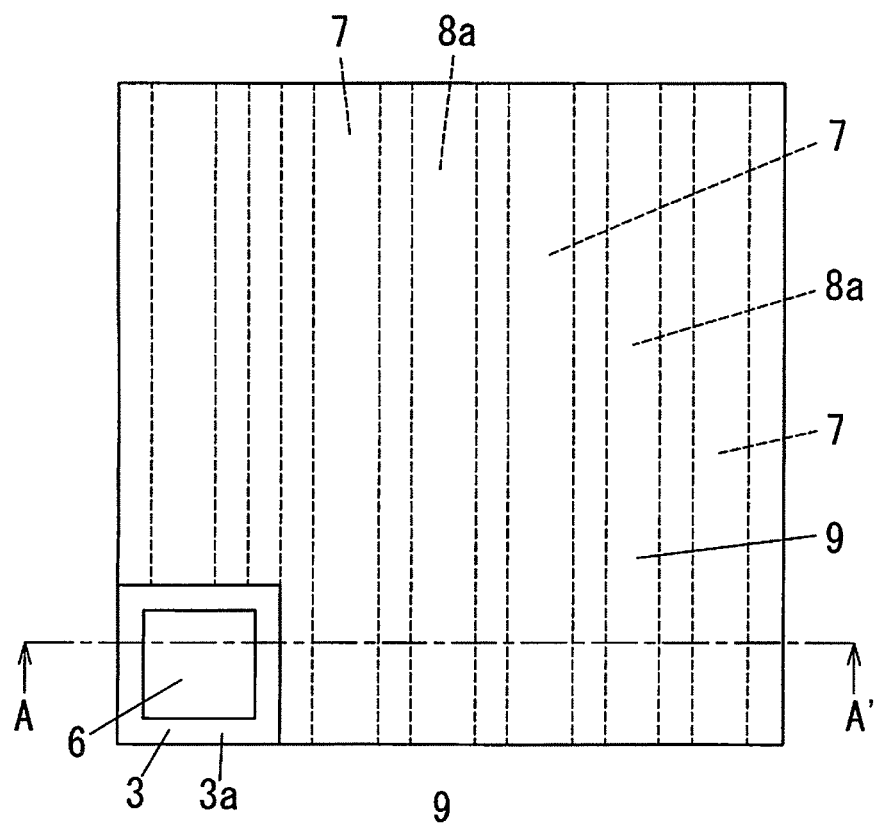
FIG. 3A is a schematic plan view.
Figure 3B:
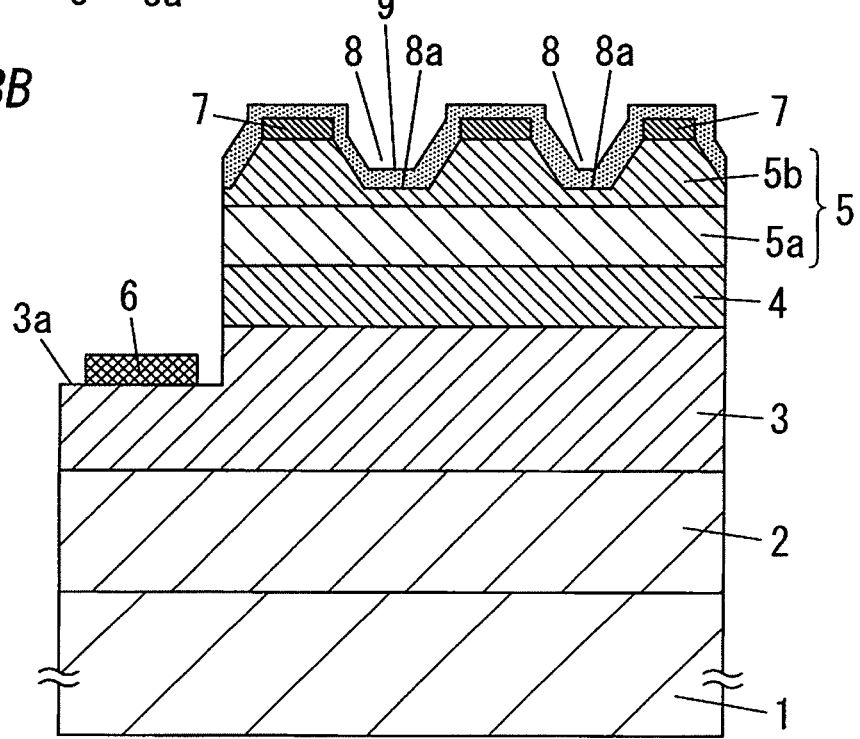
FIG. 3B is a schematic cross-sectional view taken along A-A' in FIG. 3A.

A basic configuration of an ultraviolet semiconductor light-emitting element of the present embodiment is substantially similar to that of Embodiment 1, the difference therebetween being in that the reflective film 9 is extended to above the p-electrode 7, as shown in FIG. 3. The constituent elements similar to those of Embodiment 1 are assigned with same reference numerals and the explanation thereof is herein omitted.

Further, another difference between the present embodiment and the above-described embodiments is that the p-type electrodes 7 are formed in the shape of stripes, a plurality of depressed parts 8 are formed in the shape of stripes in the p-type nitride semiconductor layer 5, and all p-electrodes 7 are electrically connected by the reflective film 9.

The reflective film 9 of the ultraviolet semiconductor light-emitting element of the present embodiment is formed to cover the inner bottom surface 8a and inner side surface of each depressed part 8 in the p-type nitride semiconductor layer 5, the region of the surface of the p-type nitride semiconductor layer 5 where the depressed parts 8 and the reflective film 9 are not formed, and the surface of the p-electrode 7. Therefore, in the ultraviolet semiconductor light-emitting element of the present embodiment, all p-electrodes 7 can be electrically connected by the reflective film 9, and the reflective film 9 can be imparted with a function of a protective layer that protects the p-electrodes 7. With such a configuration of the present embodiment, the depressed parts 8 have a tapered shape such that the opening surface area gradually increases with increasing distance from the inner bottom surface 8a and therefore the reflective film 9 can be prevented from disconnection. The opening shape and arrangement of the depressed parts 8 may be the same as in Embodiment 1.

A method for manufacturing the ultraviolet semiconductor light-emitting element of the present embodiment is basically the same as in Embodiment 1, the difference being only in the pattern of the resist layer used for forming the p-electrodes 7. This resist layer is patterned to cover only the surface 3a of the n-type nitride semiconductor layer 3 and the n-electrode 6.

Further, in the structure of the ultraviolet semiconductor light-emitting element of Embodiment 2, the reflective film 9 may be extended to above the p-electrodes 7 in the same manner as in the present embodiment. Further, when constituent elements including a material same as that of the reflective film 9 are present, as constituent elements of the p-electrodes 7, those constituent elements and the reflective film 9 may be formed simultaneously. A reflective film that reflects ultraviolet light may be also provided on the n-electrode 6 and a zone where the n-electrode 6 is not formed on the surface 3a of the n-type nitride semiconductor layer 3.

The ultraviolet semiconductor light-emitting element of the present embodiment has a configuration similar to that of Embodiment 1. As a result, the ultraviolet semiconductor light-emitting element can have a combination of technical features disclosed in Embodiment 1.

Further, the technical features disclosed in the present embodiment can be also combined with the technical features disclosed in Embodiment 2.

EXPLANATION OF REFERENCE NUMERALS 1 substrate
3 n-type nitride semiconductor layer
4 light-emitting layer
5 p-type nitride semiconductor layer
5a p-type clad layer
5b p-type contact layer
6 n-electrode
7 p-electrode
8 depressed part
8a inner bottom surface
9 reflective film

The invention claimed is:

1. An ultraviolet semiconductor light-emitting element, comprising:
   a light-emitting layer which is arranged between an n-type nitride semiconductor layer and a p-type nitride semiconductor layer;
   an n-electrode that is in contact with the n-type nitride semiconductor layer; and
   a p-electrode that is in contact with the p-type nitride semiconductor layer,
   wherein a depressed part is formed in a reverse side surface of a surface of the p-type nitride semiconductor layer facing the light-emitting layer so as to avoid an region on which the p-electrode is formed,
   a reflective film that reflects ultraviolet light emitted from the light-emitting layer is formed on an inner bottom surface of the depressed part,
   in the ultraviolet semiconductor light-emitting element, the ultraviolet light emitted from the light-emitting layer is taken out from an opposite side of the n-type nitride semiconductor layer from the light-emitting layer, and
   a depth of the depressed part is less than a thickness of the p-type nitride semiconductor layer.

2. The ultraviolet semiconductor light-emitting element according to claim 1, wherein the depressed part formed in the p-type nitride semiconductor layer comprises a plurality of depressed parts.

3. The ultraviolet semiconductor light-emitting element according to claim 2, wherein the p-type nitride semiconductor layer comprises at least a p-type contact layer that has a band gap smaller than that of the light-emitting layer and is in ohmic contact with the p-electrode.

4. The ultraviolet semiconductor light-emitting element according to claim 3, wherein the p-type nitride semiconductor layer includes the p-type contact layer and a p-type clad layer having a band gap larger than that of the p-type contact layer in this order from the p-electrode side.

5. The ultraviolet semiconductor light-emitting element according to claim 4,
wherein the depth of the depressed part is more than a thickness of the p-type contact layer, and
the depth of the depressed part is less than a sum of the thickness of the p-type contact layer and a thickness of the p-type clad layer.

6. The ultraviolet semiconductor light-emitting element according to claim 3,
wherein the depth of the depressed part is at most equal to a thickness of the p-type contact layer.

7. The ultraviolet semiconductor light-emitting element according to claim 1, wherein the p-type nitride semiconductor layer comprises at least a p-type contact layer that has a band gap smaller than that of the light-emitting layer and is in ohmic contact with the p-electrode.

8. The ultraviolet semiconductor light-emitting element according to claim 7, wherein the p-type nitride semiconductor layer includes the p-type contact layer and a p-type clad layer having a band gap larger than that of the p-type contact layer in this order from the p-electrode side.

9. The ultraviolet semiconductor light-emitting element according to claim 8,
wherein the depth of the depressed part is more than a thickness of the p-type contact layer, and
the depth of the depressed part is less than a sum of the thickness of the p-type contact layer and a thickness of the p-type clad layer.

10. The ultraviolet semiconductor light-emitting element according to claim 7,
wherein the depth of the depressed part is at most equal to a thickness of the p-type contact layer.

11. The ultraviolet semiconductor light-emitting element according to claim 1, wherein the reflective film is extended to above the p-electrode.

12. The ultraviolet semiconductor light-emitting element according to claim 1,
wherein the p-type nitride semiconductor layer has a surface facing the light-emitting layer, and
a distance from the surface of the p-type nitride semiconductor layer facing the light-emitting layer to the inner bottom surface of the depressed part is at most equal to 10 nm.

13. The ultraviolet semiconductor light-emitting element according to claim 1, wherein the reflective film is smaller in planar size than the inner bottom surface of the depressed part.

14. The ultraviolet semiconductor light-emitting element according to claim 13, wherein the reflective film is not formed on side surfaces of the depressed part.

15. The ultraviolet semiconductor light-emitting element according to claim 1, wherein the reflective film is formed on side surfaces of the depressed part.

16. The ultraviolet semiconductor light-emitting element according to claim 1, wherein the reflective film is provided on the n-electrode.

17. The ultraviolet semiconductor light-emitting element according to claim 1, wherein the reflective film is provided on at least a part of a surface of the n-type nitride semiconductor layer where the n-electrode is not formed.

* * * * *